United States Patent
Chen et al.

(10) Patent No.: US 7,320,942 B2
(45) Date of Patent: Jan. 22, 2008

(54) METHOD FOR REMOVAL OF METALLIC RESIDUE AFTER PLASMA ETCHING OF A METAL LAYER

(75) Inventors: Xiaoyi Chen, Foster City, CA (US);
Chentsau Ying, Cupertino, CA (US);
Padmapani C. Nallan, San Jose, CA (US); Ajay Kumar, Sunnyvale, CA (US); Ralph C. Kerns, San Carlos, CA (US); Ying Rui, Sunnyvale, CA (US); Chun Yan, San Jose, CA (US); Guowen Ding, Sunnyvale, CA (US); Wai-Fan Yau, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/285,967

(22) Filed: Nov. 1, 2002

(65) Prior Publication Data

US 2003/0219912 A1 Nov. 27, 2003

Related U.S. Application Data

(60) Provisional application No. 60/384,686, filed on May 31, 2002, provisional application No. 60/382,249, filed on May 21, 2002.

(51) Int. Cl.
*H01L 21/302* (2006.01)
*H01L 21/308* (2006.01)

(52) U.S. Cl. .......................... 438/754; 438/906; 438/3

(58) Field of Classification Search ................ 438/745, 438/754, 906, 3; 134/1.3, 902
See application file for complete search history.

(56) References Cited

U.S. PATENT DOCUMENTS

| | | | | |
|---|---|---|---|---|
| 4,446,115 A | * | 5/1984 | Endo et al. .................... | 423/63 |
| 5,017,513 A | * | 5/1991 | Takeuchi .................... | 438/688 |
| 5,022,961 A | * | 6/1991 | Izumi et al. ................ | 438/743 |
| 5,277,835 A | * | 1/1994 | Ohmi et al. ................ | 252/79.3 |
| 5,326,429 A | * | 7/1994 | Cohen et al. .................. | 216/22 |
| 5,391,511 A | | 2/1995 | Doan et al. ................... | 437/49 |
| 5,472,513 A | * | 12/1995 | Shiramizu ...................... | 134/3 |
| 5,487,398 A | * | 1/1996 | Ohmi et al. ................ | 134/95.1 |
| 5,650,041 A | * | 7/1997 | Gotoh et al. ................ | 438/618 |
| 5,681,398 A | * | 10/1997 | Muraoka ........................ | 134/3 |
| 5,800,632 A | * | 9/1998 | Arao et al. .................. | 136/251 |
| 5,837,662 A | | 11/1998 | Chai et al. .................. | 510/175 |
| 5,981,454 A | * | 11/1999 | Small ......................... | 510/175 |
| 6,010,927 A | * | 1/2000 | Jones et al. ................ | 438/210 |
| 6,074,961 A | | 6/2000 | Chang et al. ................ | 438/756 |
| 6,127,282 A | | 10/2000 | Lopatin ...................... | 438/754 |
| 6,129,091 A | | 10/2000 | Lee et al. ...................... | 134/3 |
| 6,174,818 B1 | | 1/2001 | Tao et al. .................... | 438/733 |
| 6,200,896 B1 | * | 3/2001 | Sethuraman et al. ........ | 438/691 |
| 6,207,565 B1 | | 3/2001 | Yeh et al. .................... | 438/669 |
| 6,235,693 B1 | | 5/2001 | Cheng et al. ................ | 510/175 |
| 6,245,650 B1 | * | 6/2001 | Watanabe .................... | 438/580 |
| 6,315,913 B1 | * | 11/2001 | Engelhardt et al. ........... | 216/13 |
| 6,329,299 B1 | * | 12/2001 | Wu et al. .................... | 438/745 |

(Continued)

*Primary Examiner*—M. Wilczewski
(74) *Attorney, Agent, or Firm*—Moser IP Law Group

(57) ABSTRACT

A method for removal of metallic residue from a substrate after a plasma etch process in a semiconductor substrate processing system by cleaning the substrate in a hydrogen fluoride solution.

19 Claims, 9 Drawing Sheets

U.S. PATENT DOCUMENTS

| | | | |
|---|---|---|---|
| 6,453,914 B2 * | 9/2002 | Torek et al. | 134/1.2 |
| 6,562,726 B1 * | 5/2003 | Torek et al. | 438/745 |
| 6,589,882 B2 * | 7/2003 | Andreas et al. | 438/745 |
| 6,627,548 B1 * | 9/2003 | Kruwinus et al. | 438/689 |
| 6,683,007 B1 * | 1/2004 | Yamasaki et al. | 438/745 |
| 6,783,694 B1 * | 8/2004 | Lee et al. | 252/79.1 |
| 6,830,628 B2 * | 12/2004 | Bergman | 134/3 |
| 6,893,893 B2 * | 5/2005 | Nallan et al. | 438/61 |
| 6,936,544 B2 * | 8/2005 | Huang et al. | 438/692 |
| 6,984,585 B2 * | 1/2006 | Ying et al. | 438/689 |
| 7,008,837 B2 * | 3/2006 | Won et al. | 438/239 |
| 2001/0051440 A1 | 12/2001 | Torek et al. | 438/745 |
| 2002/0022318 A1 | 2/2002 | Choi | 438/253 |
| 2002/0119245 A1 * | 8/2002 | Verhaverbeke | 427/58 |
| 2005/0000942 A1 * | 1/2005 | Lee et al. | 216/83 |
| 2005/0263489 A1 * | 12/2005 | Kraus et al. | 216/83 |
| 2005/0279381 A1 * | 12/2005 | Masuda et al. | 134/2 |
| 2006/0270242 A1 * | 11/2006 | Verhaverbeke et al. | 438/745 |
| 2007/0051700 A1 * | 3/2007 | Lee et al. | 216/83 |

* cited by examiner

US 7,320,942 B2

METHOD FOR REMOVAL OF METALLIC RESIDUE AFTER PLASMA ETCHING OF A METAL LAYER

CROSS-REFERENCE TO RELATED APPLICATIONS

This application claims benefit of U.S. provisional patent applications Ser. No. 60/382,249, filed May 21, 2002 and Ser. No. 60/384,686, filed May 31, 2002, which both are herein incorporated by reference.

BACKGROUND OF THE INVENTION

1. Field of the Invention

The present invention generally relates to a method for fabrication devices on semiconductor substrates. More specifically, the invention relates to a method for removing metallic residue after plasma etching of a metal layer.

2. Description of the Related Art

Magneto-resistive random access memory (MRAM) has been developed as a new type of non-volatile memory. Digital information in MRAM is represented by a direction of magnetization of a magnetic material. MRAM has a plurality of memory cells that are interconnected to one another to facilitate storage of information within the MRAM. A memory cell in a MRAM device generally is a multi-layered structure comprising a pair of magnetic layers separated by a tunnel layer. These layers are deposited as overlying blanket films, layer-by-layer, and then featured to form the MRAM device. More specifically, the MRAM device comprises a free (or top) magnetic layer that may change a direction of magnetization and a bottom magnetic layer that has a fixed direction of magnetization. The magnetic layers are separated by a thin tunnel layer formed of a non-magnetic dielectric material such as aluminum oxide ($Al_2O_3$) and the like. The top and bottom magnetic layers may each comprise a plurality of layers of magnetic materials such as permalloy (NiFe), cobalt iron (CoFe), and the like. The top and bottom magnetic layers are also supplied with film electrodes (e.g., comprising conductors such as tantalum (Ta), tantalum nitride (TaN), copper (Cu), and the like) to form an electrical connection for the memory cell to the lines of the MRAM.

Fabrication of a MRAM device comprises etch processes in which one or more layers of a MRAM film stack are removed, either partially or in total. During the etch processes, the metal layers within the MRAM film stack are generally etched using a plasma comprising fluorine or chlorine chemistry. Residues containing metal chlorides and fluorides may build up along the sides of the MRAM film stack and form a conductive veil after the mask is removed. Further, when carbon-based photoresist etch mask is used during the etch processes, a metal-containing polymer may also form upon the MRAM film stack. The conductive residues may cause electrical short-circuits within a MRAM device, e.g., between the magnetic layers separated by the tunnel layer, or may render the MRAM device to operate sub-optimally or not at all.

Therefore, there is a need in the art for a method of removing metallic residue after etching a MRAM film stack.

SUMMARY OF THE INVENTION

The present invention is a method of removing metallic residue from a substrate after plasma etching a metal layer. The method uses a cleaning process which comprises exposing the substrate to a hydrogen fluoride (hydrofluoric acid (HF)) solution after the plasma etch process.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method of removing metallic residue after etching an MRAM film stack formed on a substrate (also referred to herein as a wafer) in a semiconductor substrate processing system.

Figure 1A:
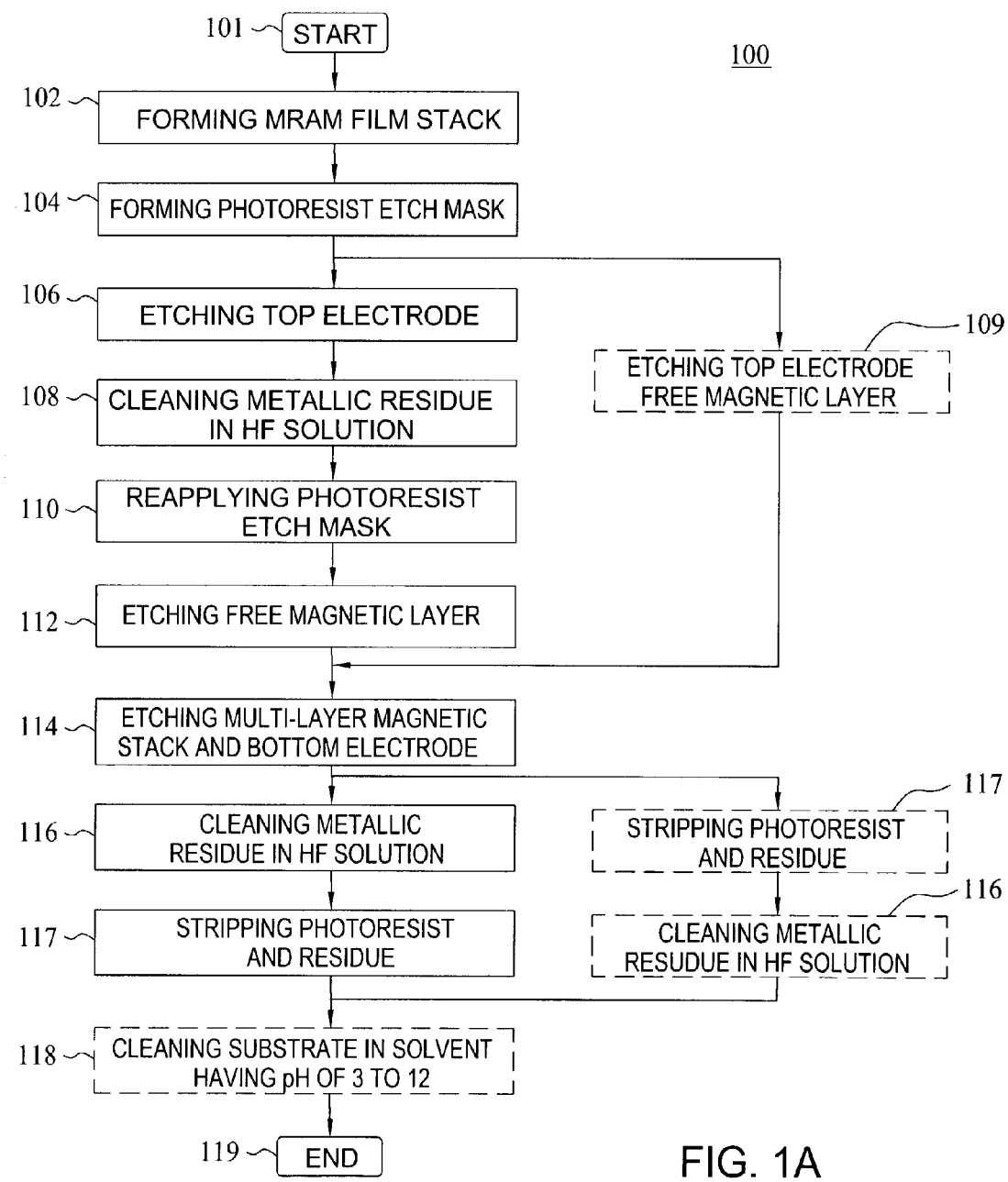
FIGS. 1A and 1B depict flow diagrams of embodiments of the present invention.
Figure 1B:
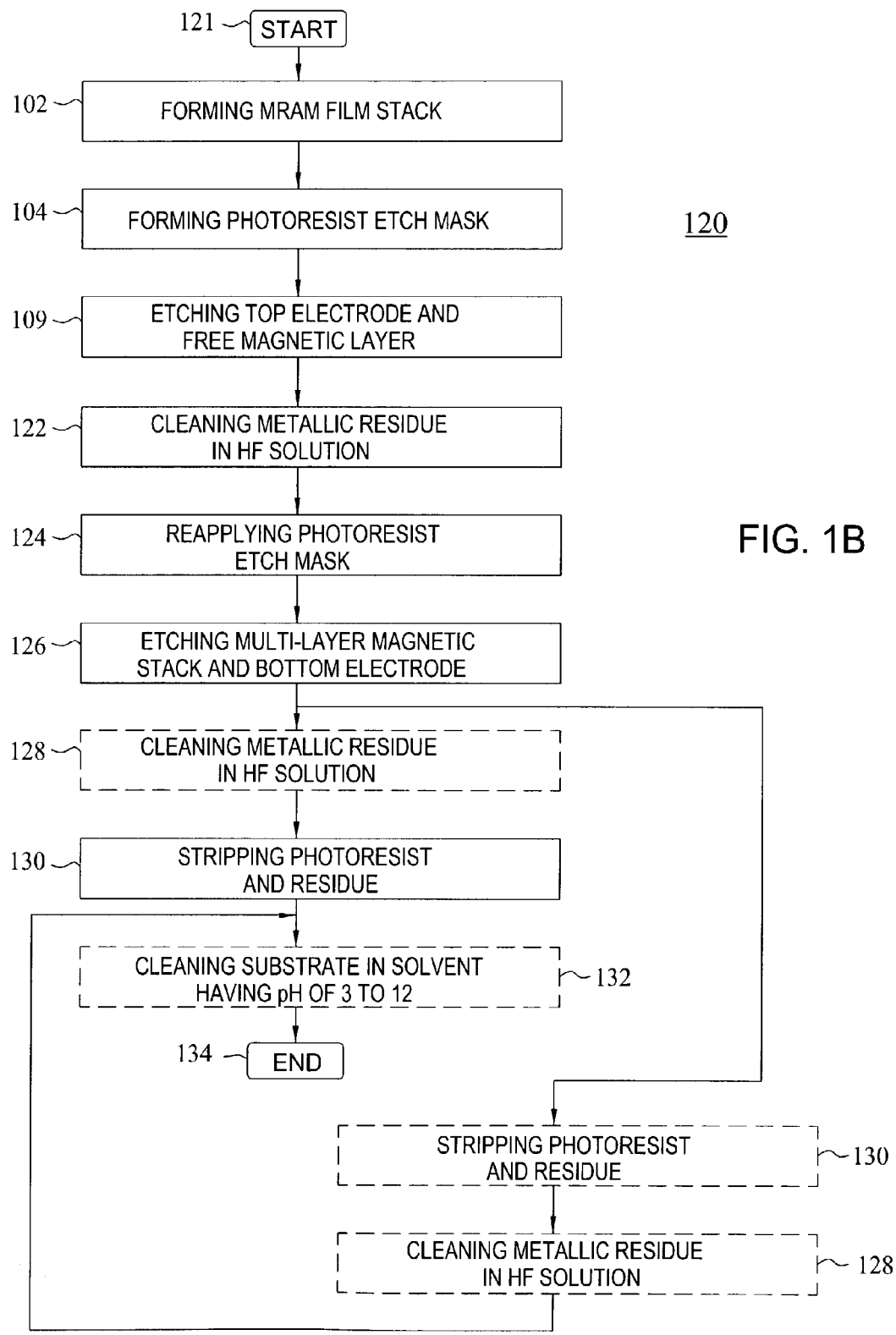

FIGS. 1A and 1B depict flow diagrams of exemplary embodiments of the invention as used during fabrication of a MRAM device as methods 100 and 120, respectively.

FIGS. 2A-2J depict a sequence of schematic, cross-sectional views of a substrate comprising a MRAM device being formed therein using the sequence 100. To best understand the invention, the reader should simultaneously refer to FIGS. 1 and 2A-2J. The cross-sectional views in FIGS. 2A-2J relate to individual process steps that are used to form the device. Sub-processes and lithographic routines (i.e., exposure and development of photoresist, and the like) are not shown in FIG. 1 and FIGS. 2A-2J. The images in FIGS. 2A-2J are not depicted to scale and are simplified for illustrative purposes. The formation of MRAM devices is only an illustrative application of the invention. Those skilled in the art will realize that the invention can be used to clean metallic residue from substrates in other applications where metal layers are etched and metallic residues are formed.

The method 100 (FIG. 1A) begins at step 101 and proceeds to step 102.

Figure 2A:
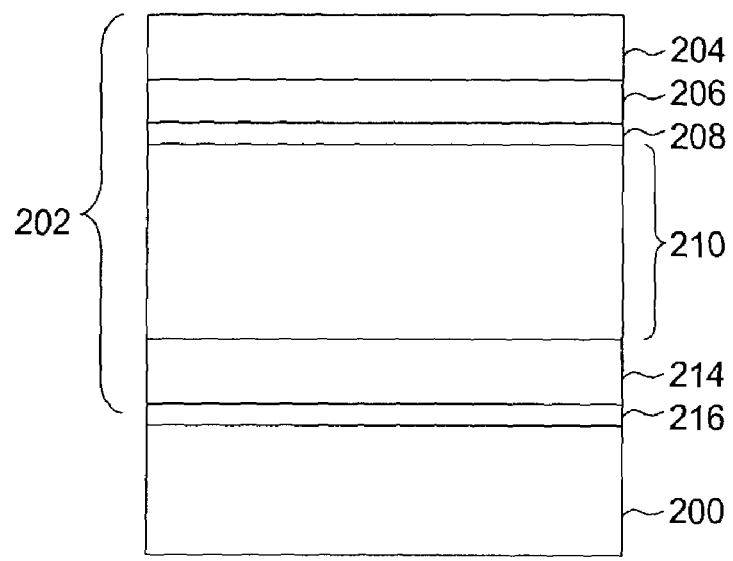
FIGS. 2A-2J depict a sequence of schematic, cross-sectional views of a substrate having a MRAM film stack being formed in accordance with an example of an embodiment of the present invention.

At step 102, a MRAM film stack 202 is formed on a wafer 200 (FIG. 2A). In one embodiment, the stack 202 is formed upon a barrier layer 216 and comprises a top electrode layer 204, a free magnetic layer 206, a tunnel layer 208, a multi-layer magnetic stack 210, and a bottom electrode layer 214. In one exemplary embodiment, the magnetic stack 210 is a multi-layer stack that comprises layers of CoFe, Ru, CoFe, PtMn, NiFe, NiFeCr. Alternatively, in the magnetic stack 210, a PtMn layer may be replaced by an IrMn layer. The tunnel layer 208 generally is formed from a dielectric material such as alumina ($Al_2O_3$) and the like to a thickness of about 10 Angstroms. The tunnel layer 208 is sandwiched between the free magnetic layer 206 and the magnetic stack 210 to form a magnetic tunnel junction of the MRAM device. The layer 206 is formed, e.g., from materials comprising nickel and cobalt iron alloys such as CoFe, NiFe, and the like. The layer 206 may consist of one or more sub-layers (or films) and generally is formed to a thickness of about 20-200 Angstroms. In one example, the top electrode 204 and the bottom electrode layer 214 are formed from conductors such as tantalum (Ta), copper (Cu), tantalum nitride (TaN), and the like to a thickness of about 200-600 Angstroms.

It should be understood, however, that the MRAM film stack 202 may comprise layers that are formed from other materials or layers having a different thickness.

The layers comprising the MRAM film stack 202 may be deposited using a vacuum deposition technique such as an atomic layer deposition (ALD), a physical vapor deposition (PVD), a chemical vapor deposition (CVD), evaporation, and the like. Fabrication of the MRAM devices may be performed using the respective processing modules of CENTURA®, ENDURA®, and other semiconductor wafer processing systems available from Applied Materials, Inc. of Santa Clara, Calif. and others.

Figure 2B:
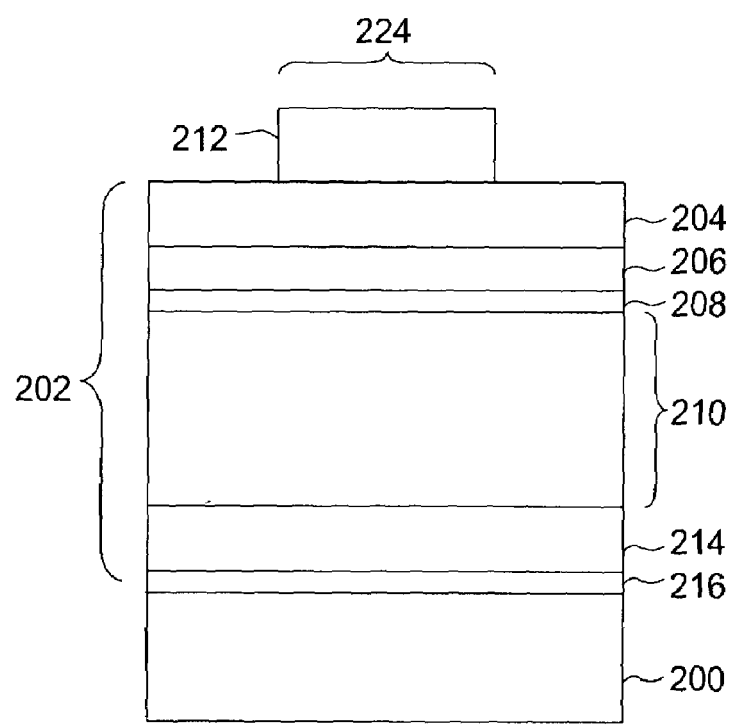

At step 104, an etch mask 212 is formed on top of the MRAM film stack 202 (FIG. 2B). The etch mask 212 generally comprises a carbon-based photoresist which is applied using a well-known application method to a thickness of about 6000 Angstroms. The etch mask 212 may also comprise an anti-reflective layer (not shown) that controls a reflection of the light during exposure of the photoresist. As feature sizes are reduced, inaccuracies in an etch mask pattern transfer process can arise from optical limitations inherent to the lithographic process such as the light reflection. The anti-reflective layer may be composed from silicon nitride (SiN), polyamides, and the like. In some applications, the anti-reflective layer may not be necessary. As such, the anti-reflective layer is considered optional. Further, the photoresist layer is patterned using a conventional lithographic patterning process. During such process, the photoresist layer is optically exposed through a patterned mask, developed, and the undeveloped portion of the photoresist is removed. The remaining developed photoresist is generally a carbon-based polymer that forms an etch mask 212 in the region 224 of the film stack 202 that is protected during an etch process.

Figure 2C:
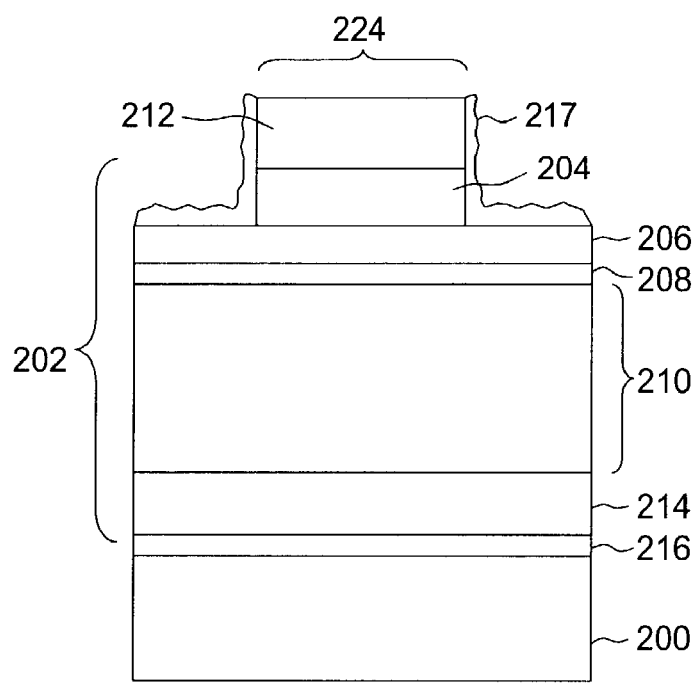
Figure 2D:
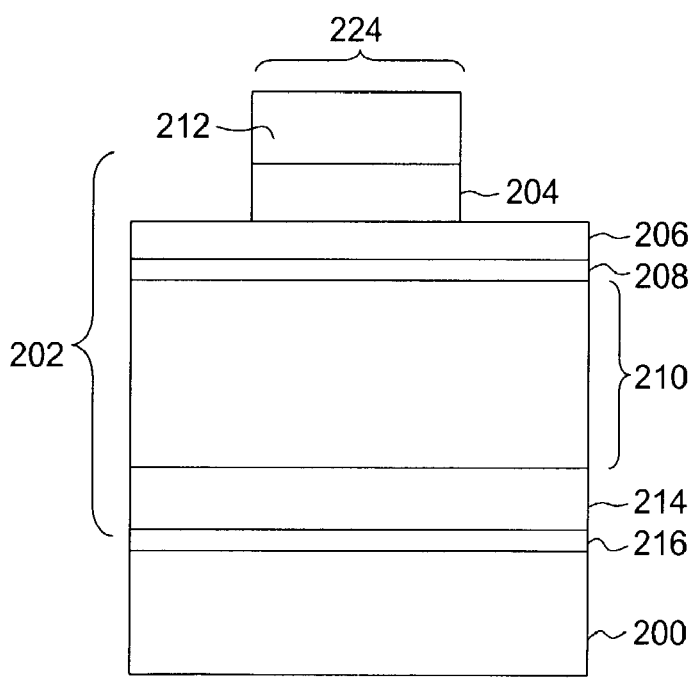
Figure 2E:
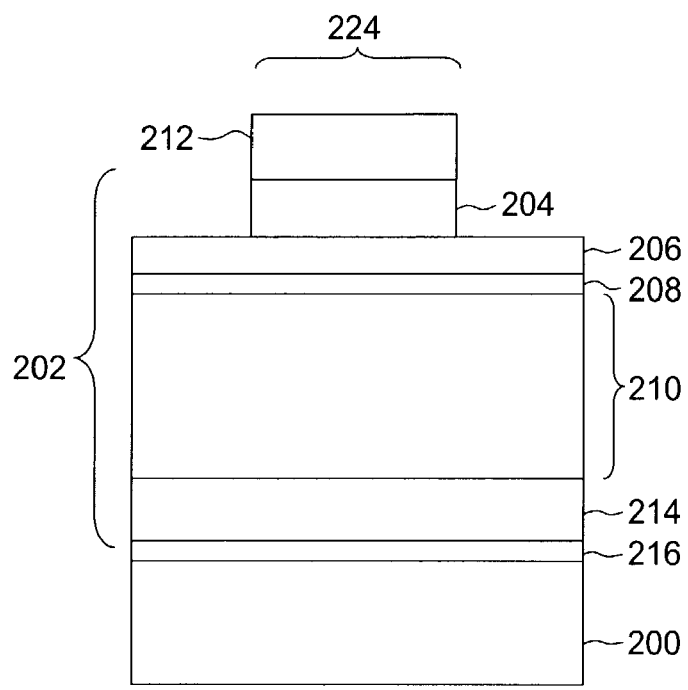

At step 106, the top electrode 204 is plasma etched (FIG. 2C). Step 112 may use a chlorine-based or fluorine-based etching chemistry. In one embodiment, the top layer 204 is etched using an etchant comprising chlorine ($Cl_2$), hydrogen chloride (HCl), and argon (Ar). Alternatively, the etchant may comprise carbon tetrafluoride ($CF_4$), trifluoromethane ($CHF_3$), and argon.

Step 106 can be accomplished in a Decoupled Plasma Source (DPS) II reactor of the CENTURA® system. In the DPS II reactor, the ion density and ion energy may be controlled independently using a plasma power source and biasing power source, respectively. The plasma power source generates and sustains a high density plasma, while the biasing power source electrically biases the wafer. The DPS II reactor provides a wide process window over changes in plasma and biasing powers, etch gas chemistry and pressure, wafer temperature, and the like. The process time can be terminated, for example, by using an endpoint detection system to detect a particular optical emission, upon a particular duration occurring, or upon some other indicator suitable for determining the end of the etch process.

During step 106, the etched metal (e.g., Ta, TiN, Cu, and the like) from the layer 204 combines with components of the etchant chemistry, as well as with components of the photoresist etch mask 212 and by-products of the etch process to form a conductive residue 217. The conductive residue 217 deposits on the etched surfaces of the MRAM film stack 202 and elsewhere on the wafer 200.

At step 108, the conductive residue 217 is removed (FIG. 2D) using a post-etch wet process which comprises cleaning the substrate 200 in a hydrogen fluoride (hydrofluoric acid (HF)) solution, that is followed by a rinse in distilled water. After step 108, metal atoms are removed from the residue 217. In addition, the photoresist etch mask 212 and conductive residue 217 are weakened and partially consumed by the hydrogen fluoride solution. As such, in certain applications, the conductive residue 217 may be entirely removed using the hydrogen fluoride solution. In one embodiment, step 108 is performed using is a single substrate wet cleaning module of an integrated processing platform (discussed in reference to FIGS. 3 and 4 below), both available from Applied Materials, Inc. of Santa Clara, Calif. In an alternative embodiment, step 108 may be performed using a wet dip of the wafer 200 into the hydrogen fluoride solution, followed by a rinse in distilled water in either a single wafer or batch bath, including ultra-sonically enhanced bath.

In one embodiment, the hydrogen fluoride solution of step 116 comprises hydrogen fluoride and deionized water. In particular, the hydrogen fluoride solution comprises between 0.1 to 10% of hydrogen fluoride by weight. When used to clean the post-etch conductive residue or veils, the hydrogen fluoride solution has a temperature between 10 to 30 degrees Celsius. Duration of the cleaning process using the solution is generally between 1 and 10 minutes. In one embodiment, the wafer was cleaned using the hydrogen fluoride solution comprising about 1% of hydrogen fluoride by weight, at a temperature of about 20 degrees Celsius, and for a duration of about 3 minutes. After cleaning in the hydrogen fluoride solution, the wafer 200 was rinsed in distilled water to remove any remaining traces of the solution, generally, for about 20 to 60 seconds.

When the hydrogen fluoride solution removes metal atoms from the conductive residue 217, the solution transforms such residue into non-conductive compounds. Further examination of the cleaning process has revealed that the post-etch cleaning in the hydrogen fluoride solution is specifically efficient during removing atoms of tantalum, titanium, copper, and the like from various residues, including the plasma-hardened and veil-like residues that generally remain after the photoresist mask 212 is removed.

At step 110, the etch mask 212 is reapplied (FIG. 2E) using, e.g., the processes described above in reference to step 104. As such, step 110 restores the etch mask to the original thickness of about 6000 Angstroms. In some embodiments, the etch mask, that remains upon the MRAM film stack 202 after step 108, may be stripped prior to reapplication of the photoresist. A process of stripping such etch mask is described below in reference to step 117.

Figure 2F:
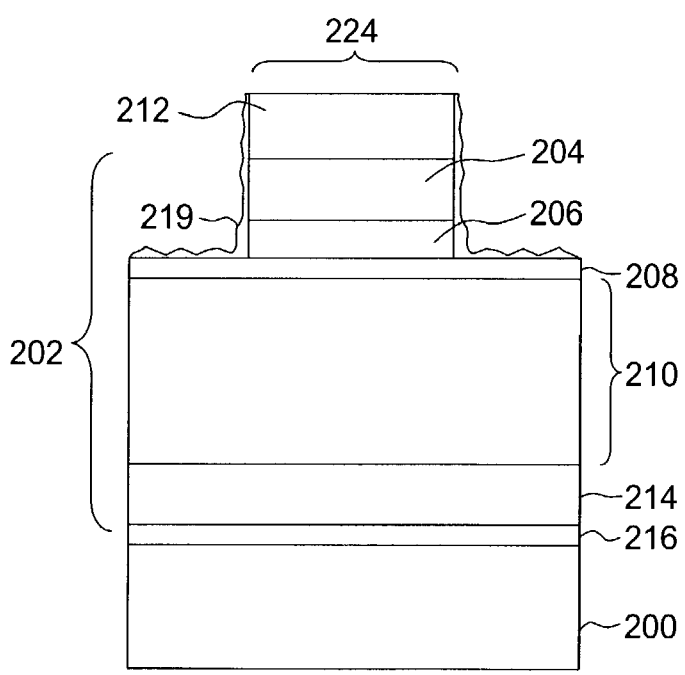
Figure 2G:
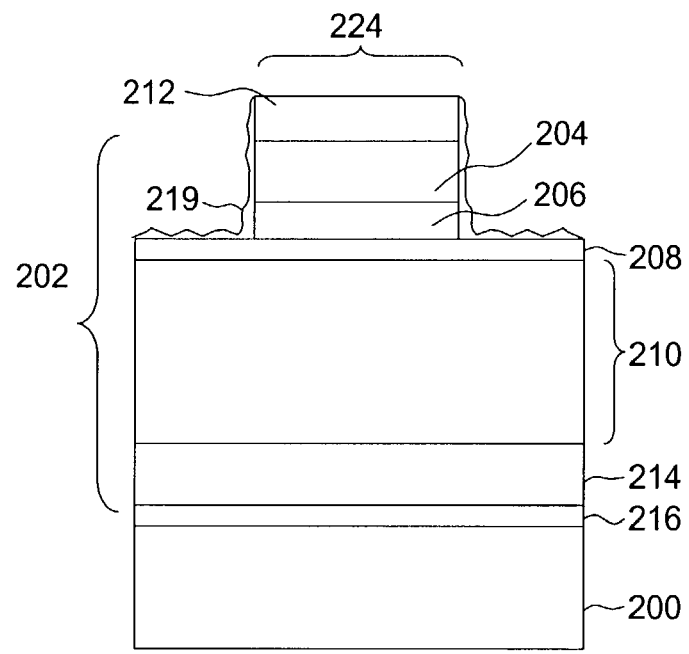

At step 112, the free magnetic layer 206 is plasma etched (FIG. 2F). In one embodiment, step 112 uses an etchant comprising chlorine, oxygen ($O_2$), and argon. Further, step 112 may use the tunnel layer 208 as an etch stop layer.

During step 112, a conductive residue 219 deposits on the etched surfaces of the MRAM film stack 202 and elsewhere on the wafer 200. The residue 219 remain on the MRAM film stack 202 upon completion of step 112. If the photoresist mask 212 were removed at this point, the residue on the sides of the mask would remain and form a veil, i.e., the residue would extend above the top of layer 204. Such veils are known to be difficult to remove and can interfere with further processing.

In an alternative embodiment, at step 109, the top electrode 204 and the free magnetic layer 206 are sequentially plasma etched in a single etch reactor (FIG. 2G), e.g., in the exemplary DPS II reactor. In one embodiment, steps 109 is performed using the etchant of step 106 to etch the top layer 204, while using a upper film of the free magnetic layer 206 as an etch stop layer. After the layer 204 has been removed, step 109 uses the etchant of step 114 to etch the free magnetic layer 206. In one illustrative embodiment, during etching the layer 206, step 112 uses the tunnel layer 208 as an intermediate etch stop layer. Such etch process is disclosed in commonly assigned U.S. patent application Ser. No. 10/218,244, filed Aug. 12, 2002, which is incorporated herein by reference. Similar to steps 106 and 112, step 109 may be accomplished in the exemplary DPS II reactor.

During step 109, the etched metal (e.g., Ta, TiN, Cu, CoFe, NiFe, and the like) from the layers 204 and 206 combines with components of the etchant chemistry, as well as with components of the photoresist etch mask 212 and by-products of the etch process to form a conductive residue 219. The conductive residue 219 deposits on the etched surfaces of the MRAM film stack 202 and elsewhere on the wafer 200. The conductive residue 219 remains on the MRAM film stack 202 upon completion of step 109.

Figure 2H:
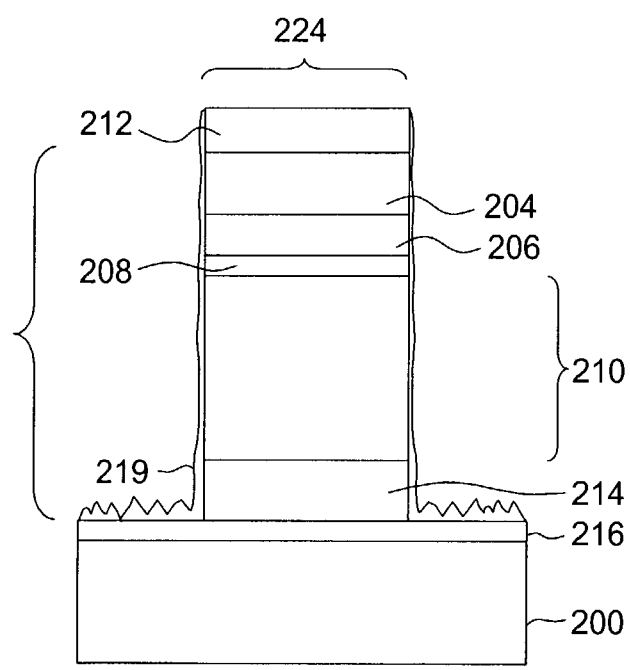
Figure 2I:
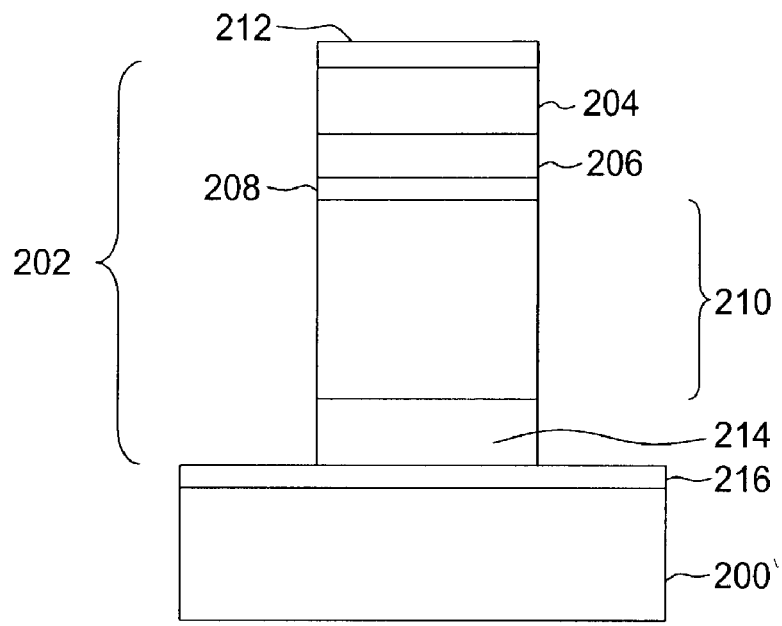

At step 114, the multi-layer magnetic stack 210 and the bottom electrode layer 214 are plasma etched (FIG. 2H). In one embodiment, step 114 may use the barrier layer 216 as an etch stop layer. In one illustrative embodiment disclosed in the referred to above U.S. patent application Ser. No. 10/218,244, the tunnel layer 208, the multi-layer magnetic stack 210 and bottom electrode layer 214 are etched using an etchant comprising boron chloride ($BCl_3$) and argon. Alternatively, the bottom electrode layer 214 may be etched separately after the tunnel layer 208 and the multi-layer magnetic stack 210 has been etched. In this embodiment, to etch the layer 214, step 114 may use, e.g., a plasma comprising chlorine and argon. Step 114 can also be performed in the DPS II reactor.

Similar to steps 112 and 109, step 114 leaves a metal-containing conductive residue that comprises metals etched from the etched layers, components of the etch mask 212, and by-products of the etch process. The residue accumulates with forgoing residue deposits 219.

After step 114, the photoresist etch mask 212, conductive residue 219 are plasma hardened, which make the photoresist difficult to be stripped. The conductive residue 219 represents a contaminant with respect to further processing of the substrate and should be removed before fabrication of the MRAM device may continue.

At step 116, the conductive residue 219 is removed by a post-etch wet process which comprises cleaning the substrate 200 in a hydrogen fluoride (hydrofluoric acid (HF)) solution, followed by a rinse in distilled water (FIG. 1I). Step 116 and step 106 may use similar process recipes, however, step 116 removes metal from the residue 219. As such, step 116 transforms the residue into non-conductive compounds, as well as weakens and partially consumes the etch mask 212.

Figure 2J:
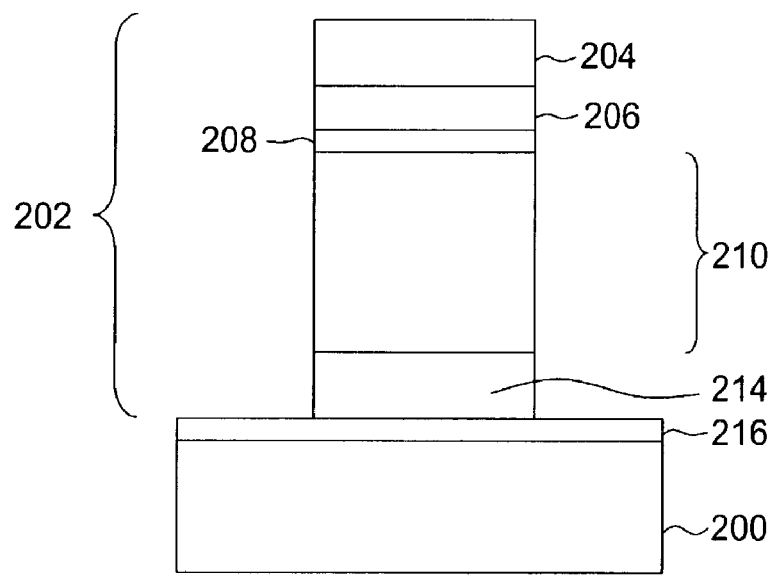

At step 117, the photoresist etch mask 212 and the remaining traces (not shown) of the residue 219 are stripped from the MRAM film stack 202 (FIG. 2J). Since the residue 219 is removed prior to removing the mask 212, a veil of residue is not formed. Step 117, for example, performs a stripping process that uses a plasma comprising an oxygen based etchant. In one embodiment, step 117 uses oxygen that is supplied into a reaction chamber in conjunction with a passivation gas such as nitrogen ($N_2$). Further, nitrogen may optionally be mixed with at least one inert gas, such as helium ($He_2$) and the like. Alternatively, step 117 may be performed using a wet etch process.

Step 117 may be accomplished, for example, in the DPS II reactor, as well as in an Advanced Strip and Passivation (ASP) reactor of the CENTURA® system.

The ASP reactor is a microwave downstream oxygen plasma reactor in which the plasma is confined to a plasma tube and only reactive neutrals are allowed to enter a process chamber. Such a plasma confinement scheme precludes plasma-related damage of the substrate or circuits formed on the substrate. In the ASP reactor, a wafer backside may be heated radiantly by quartz halogen lamps or cooled using the backside gas such that the wafer temperature can be maintained at 20 to 400 degrees Celsius. Similar to the DPS II reactor, the ASP reactor has an endpoint detection system.

In one embodiment, when the stripping process is performed in the DPS II reactor, step 117 provides oxygen at a rate of 10 to 200 sccm, as well as nitrogen ($N_2$) at a rate of 0 to 200 sccm (i.e., a $O_2:N_2$ flow ratio ranging from 1:2 to all $O_2$). Further, step 117 applies 200 to 3000 W of plasma power, 0 to 300 W of wafer biasing power, and maintains a wafer temperature at 10 to 80 degrees Celsius and a pressure in the reaction chamber at 2 to 100 mTorr. One specific process recipe provides $O_2$ at a rate of 50 sccm and $N_2$ at a rate of 50 sccm (i.e., a $O_2:N_2$ flow ratio of 1:1), 1000 W from a plasma power source and 10 W from a biasing power source, a wafer temperature of 50 degrees Celsius, and a pressure of 4 mTorr.

In another embodiment, when the stripping process is performed in the ASP reactor, step 117 provides oxygen at a rate 1000 to 7500 sccm, as well as nitrogen ($N_2$) at a rate of 0 to 500 sccm (i.e., a $O_2:N_2$ flow ratio ranging from 2:1 to all $O_2$). In this embodiment, step 117 applies microwave power of 500 to 2500 W and maintains a wafer temperature at 100 to 250 degrees Celsius and a pressure in the reaction chamber at 1 to 10 Torr. One specific process recipe provides $O_2$ at a rate of 3500 sccm and $N_2$ at a rate of 500 sccm (i.e., a $O_2:N_2$ flow ratio of 7:1), a microwave power of 1400 W, a wafer temperature of 200 degrees Celsius, and a pressure of 2 Torr.

In a further embodiment, during step 117, the stripping process may be performed, for example, in the referred to wet cleaning module using a treatment of the wafer 200 in a cleaning solvent. In one embodiment, the solvent comprises, by weight, about (0.1-10) parts of ammonium hydroxide ($NH_4OH$), (0.1-10) parts of hydrogen peroxide ($H_2O_2$), and (1-100) parts of deionized water ($H_2O$). Such solvent is commercially available under the trademark name SC1 from Rhodia, Inc., Freeport, Tex. and other suppliers. One specific recipe of the solvent comprises 1 part of $NH_4OH$, 1 part $H_2O_2$, and 10 parts of deionized water, while the solvent is applied at a temperature of about 45 to 65 degrees Celsius for a duration of about 30 to 120 seconds. After the exposure to the SC1 solvent, similar to step 108, the wafer 200 may be rinsed in distilled water to remove any remaining traces of the solvent from the wafer.

In an alternative embodiment, step 117 may be performed after step 116. In this embodiment, step 116 removes metal atoms from post-strip traces of the stripped etch mask 212 and conductive residue 219.

Step 117 generally may be followed by optional step 118. Step 118 removes any remaining post-strip traces of the photoresist and residue. Step 118 may be performed, for example, in the wet cleaning module using exposure of the wafer 200 to a solvent having a pH between about 3 and 12, such as, e.g., EKC 265 and the like. EKC 265 is commercially available from EKC Technology, Inc. of Hayward, Calif. and other suppliers. Temperature of the EKC 265 solvent during processing typically is between 20 and 80 degrees Celsius, while a duration of the treatment is about 10 to 30 minutes. In one embodiment, a duration of the treatment using solvent EKC 265 was about 20 min at a temperature of the solvent of about 65 degrees Celsius. Similar to the cleaning processes described above, after exposure to EKC 265, the wafer 200 may be rinsed in distilled water to remove any remaining traces of the solvent from the wafer. At step 119, the method 100 ends.

FIG. 1B depicts a flow diagram of the method 120 as another example of the invention. Specifically, the method 120 begins at step 121 and, similar to the method 100, sequentially performs steps 102, 104, and 109. During step 109, the conductive residue 219 is developed upon the surfaces of the wafer 200 exposed to an etchant plasma. At step 122, the wafer 200 is cleaned using the hydrogen fluoride solution. Step 122 and step 108 may use similar process recipes. As such, during step 122, the conductive residue 219 is weakened and converted into non-conductive compounds. Further, during step 122, the etch mask 212 may be partially consumed by the hydrogen fluoride solution, as discussed above in reference to the method 100. At step 124, similar to step 110, the etch mask 212 may be reapplied using, e.g., the processes described above in reference to step 104.

Further, at step 126, the multi-layer magnetic stack 210 and bottom electrode layer 214 are plasma etched using, e.g., a process described in reference to step 114. The post-etch conductive residue formed after step 126 does not combine with, respectively, the residue formed during the preceding etch step 112, since step 122 has already removed that residue. As such, the step 126 residue is easier to remove. During optional step 128, the wafer 200 may be exposed to a second treatment in the hydrogen fluoride solution that is similar to the cleaning process of step 122. Further, at step 130, the etch mask 212 and post-etch conductive residue are stripped from the wafer 200. Alternatively, similar to the method 100, step 130 may be performed prior to step 128. Lastly, any remaining post-strip traces of the photoresist and residue are removed during optional step 132. Similar to step 118, step 132 cleans the wafer 200 in the solvent having a pH between about 3 and 12, e.g., the EKC 265 solvent. Steps 126, 130, and 132 and steps 114, 117, and 118, respectively, may use similar process recipes. At step 134, the method 120 ends.

Figure 3:
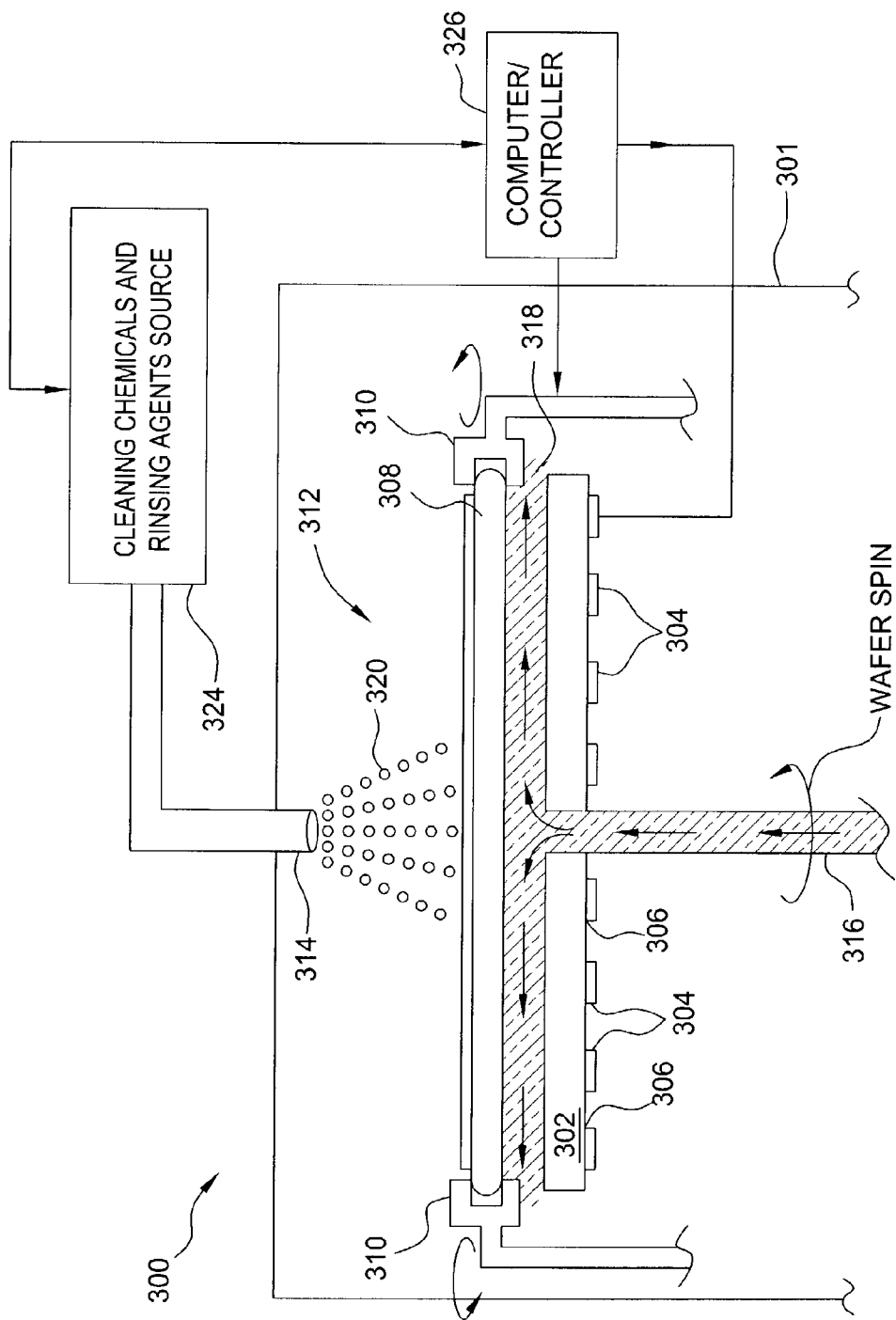
FIG. 3 depicts a schematic, cross sectional view of a wet cleaning module.

One illustrative embodiment of an apparatus that can be used for cleaning and rinsing a substrate in accordance with the present invention is a single substrate wet cleaning module. FIG. 3 depicts a simplified cross-sectional view of an illustrative embodiment of a single substrate wet cleaning module 300. The module 300 is described in detail in U.S. patent application Ser. No. 09/945,454, filed Aug. 31, 2001, which is herein incorporated by reference.

The module 300 applies cleaning chemicals and/or rinsing agents to the top and bottom of a substrate. To enhance the cleaning process, the module 300 uses acoustic or sonic waves to agitate the cleaning chemicals and/or rinsing agents.

The module 300 comprises a chamber 301, a nozzle 314, and a substrate support 312. The substrate support is mounted within the chamber 301 and comprises edge claps 310, plate 302 and a plurality of acoustic or sonic transducers 304. The plate 302 has a shape that is substantially the same as a substrate and supports the plurality of acoustic or sonic transducers 304. The plate 302 is, for example, made of aluminum, but can be formed of other materials such as, but not limited to, stainless steel and sapphire. The plate 302 is coated with a corrosion resistant fluoropolymer such as HALAR or PFA. The transducers 304 are attached to the bottom of the plate 302 using an adhesive, for example, an epoxy 306. In one embodiment of the cleaning module 300, the transducers 304 are arranged in an array that covers substantially the entire bottom surface of plate 302, e.g., approximately 80% of plate 302. The transducers generate sonic waves in the frequency range between 400 kHz and 8 MHz. In one embodiment of the module 300, the transducers are piezoelectric devices.

The plurality of edge clamps 310 retain the substrate 308 face up above the plate 302 to form a gap 318 between the backside of the wafer and the top surface of the plate 302. Cleaning chemicals and/or rinsing agents are provides to the gap via channel 316. The clamps are rotated to cause the substrate 308 to rotate about its central axis at a rate between 0 and 6000 rpm. In this embodiment of the module 300, the substrate 308 and clamps 310 rotate, while the plate 302 is stationary.

The nozzle 314 sprays cleaning chemicals and/or rinsing agents upon the top of the substrate 308 (i.e., the surface of the substrate comprising features, transistors, or other circuitry). As the nozzle 314 sprays the top of the substrate 308, the same or different cleaning chemicals and/or rinsing agents are supplied to the gap 318 via channel 316 as the substrate is rotated such that the cleaning chemicals and/or rinsing agents flow across the top and bottom surfaces of the substrate.

The nozzle 314 and channel 316 are coupled to a source 324 of cleaning chemicals and/or rinsing agents. The source 324 may be the same for the nozzle 314 and channel 316, or a separate source may be couple to each of the nozzle 314 and channel 316. In the present embodiment of the invention, the module 300 is used to clean the substrate 308 using hydrogen fluoride, ammonium fluoride, hydrogen peroxide, ammonium hydroxide and deionized water. The module 300 is further used to rinse the substrate in deionized water.

A computer controller 326 is generally used to control the operation of the module 300. Specifically, the computer controller 326 controls the rotation of the substrate support 312, the activation of the transducers 304, the supply of cleaning chemicals and/or rinsing agents, and so on.

Figure 4:
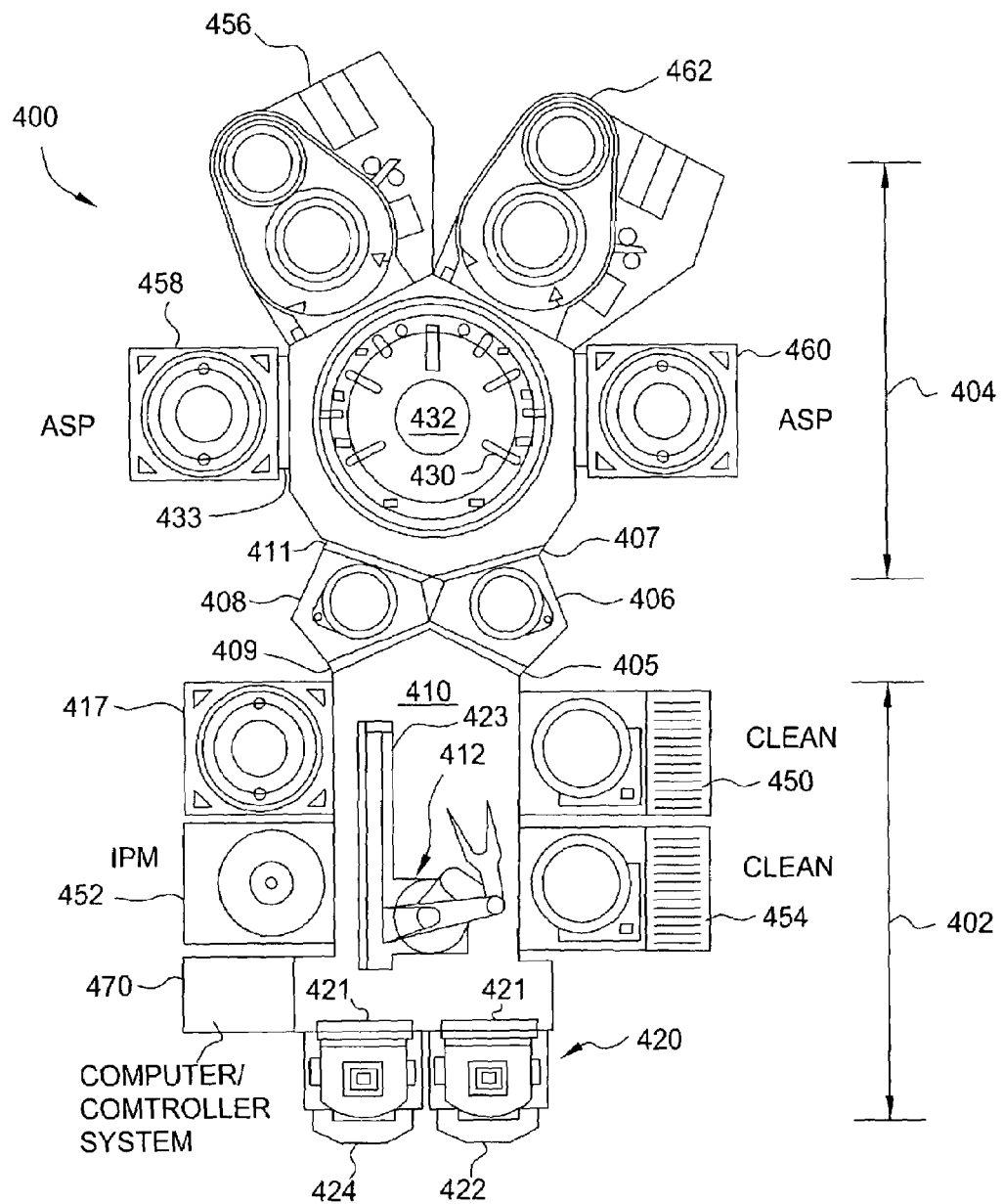
FIG. 4 depicts a schematic, plan view of an integrated platform used to perform the method of the present invention.

The methods of the present invention are illustratively performed on an integrated processing platform 400 shown in FIG. 4 that comprises apparatus for performing both atmospheric and sub-atmospheric processing. The platform 400 and the various modules and tools that can be used with such a platform are described in detail in U.S. patent application Ser. No. 09/945,454, filed Aug. 31, 2001, which is herein incorporated by reference.

Depending upon the process modules that are used in the platform 400, the platform 400 (also referred to as a process tool) can be used to perform etching, oxidation, substrate cleaning, photoresist stripping, substrate inspection and the like. The platform 400 comprises an atmospheric platform 402 and a sub-atmospheric platform 404. The sub-atmospheric platform 404 and the atmospheric platform 402 may be coupled together by a single substrate load lock 406 or, as shown in the depicted example, are coupled together by a pair of single load locks 406 and 408. In some applications, the sub-atmospheric and atmospheric platforms 404 and 402 are not coupled together and may be used separately. In one configuration, the stand-alone platform 402 may contain photoresist stripping reactors and wet cleaning modules that perform post-etch processing.

The atmospheric platform 402 comprises a central atmospheric transfer chamber 410 containing a substrate handling device 412, such as a robot. Directly attached to the atmospheric transfer chamber 410 is a substrate wet cleaning module 450, an integrated particle monitor 452 and a critical dimension (CD) measuring tool 454, and a photoresist stripping chamber 417. A dry clean module (not shown) can also be attached to the atmospheric transfer chamber 410, if desired. Each module or tool is coupled to the transfer chamber 410 by a separately closable and sealable opening, such as a slit valve. The transfer chamber is maintained at substantially atmospheric pressure during operation. The substrate handling device 412 is able to transfer substrates from one module or tool to another module or tool that is attached to the atmospheric transfer chamber 410. In the embodiment shown, the substrate handling device 412 is a dual blade, single arm, single wrist robot. Other types of robots may be used to access the various modules and tools.

The atmospheric transfer chamber 410 is coupled to at least one substrate input/output module 420 that provides and receives substrates to and from the platform 400. In one embodiment of the platform 400, the module 420 comprises at least one front opening unified pod (FOUP). Two FOUPs 422 and 424 are depicted. The substrate handling device 412 accesses each FOUP through a sealable access door 421. The substrate handling device 412 moves linearly along a track 423 to facilitate access to all of the modules and tools.

The atmospheric transfer chamber 410 is coupled to the pair of load locks 406 and 408 through sealable doors 405 and 409 such that the substrate handling device 412 can access the load locks 406 and 408. The sub-atmospheric platform 404 comprises a central sub-atmospheric transfer chamber 430 and a plurality of process chambers 456, 458, 460, and 462. Sealable doors 407 and 411 respectively couple each load lock 406 and 408 to the sub-atmospheric transfer chamber 430. The sub-atmospheric transfer chamber 430 contains a substrate handing device 432, such as a robot (not shown), that accesses the load locks 406 and 408 as well as the process chambers 456, 458, 460 and 462. The process chambers 456, 458, 460 and 462 are each coupled to the sub-atmospheric transfer chamber 430 via separately closable and sealable openings, such as slit-valves. The process chambers 456, 458, 460 and 462 may comprise one or more etching chambers such as the DPS or DPS II chamber. Additionally, one or more photoresist stripping chambers such as the ASP chamber described above may be used as one or more of the process chambers 456, 458, 460 and 462. As also described above, the ASP chamber, if used, may be located either on the sub-atmospheric platform 404 or the atmospheric platform 402. FIG. 4 shows the sub-atmospheric platform 404 comprising two etch and oxidation chambers 458 and 460 and two photoresist stripping chambers 456 and 462. The sub-atmospheric platform 404 is, for example, a CENTURA® platform available from Applied Materials, Inc. of Santa Clara, Calif.

The platform 400 also includes a system computer 470 that is coupled to and controls each module that is coupled to the atmospheric and sub-atmospheric platforms 402 and 404, controls the substrate handling devices 412 and 432, and controls the load locks 406 and 408. Generally, the system computer 470 controls all aspects of operation of the platform 400 either by direct control of the sub-systems, modules, tools and apparatus or by controlling the computers associated with those sub-systems, modules, tools and apparatus. The system computer 470 enables feedback from one module or tool to be used to control the flow of substrates through the platform 400 and/or control the processes or operation of the various modules and tools to optimize substrate throughput.

The invention may be practiced in other semiconductor structures and devices wherein the processing parameters may be adjusted to achieve acceptable characteristics by those skilled in the arts by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A method for removal of residue after plasma etching a layer comprising a metal using a photoresist etch mask, said layer formed on a substrate, comprising:
cleaning a substrate having metallic residue from etching at least one of tantalum or tantalum nitride in a solution consisting essentially of hydrogen fluoride and deionized water to remove the metallic residue from the substrate.

2. The method of claim 1 further comprising stripping the photoresist etch mask after the cleaning step is complete.

3. The method of claim 2, wherein the stripping step further comprises:
exposing the substrate to a solvent having a pH between about 3 to 12; and
rinsing the exposed substrate in distilled water.

4. The method of claim 1, wherein the cleaning step further comprises:
rinsing the cleaned substrate with distilled water.

5. The method of claim 1, wherein said solution comprises between 0.1 and 10% of hydrogen fluoride by weight.

6. The method of claim 1, wherein said solution comprises about 1% of hydrogen fluoride by weight.

7. The method of claim 1, wherein a duration of the cleaning step is between 1 and 10 minutes.

8. The method of claim 1, wherein a duration of the cleaning step is about 3 minutes.

9. The method of claim 1, wherein a temperature of said solution during the cleaning step is between 10 to 30 degrees Celsius.

10. The method of claim 1, wherein a temperature of said solution during the cleaning step is about 20 degrees Celsius.

11. The method of claim 1 further comprising stripping the photoresist etch mask prior to cleaning the substrate.

12. The method of claim 11, wherein the stripping step further comprises:
exposing the substrate to a solvent having a pH between about 3 to 12; and
rinsing the exposed substrate in distilled water.

13. The method of claim 1, wherein, prior to performing the step of cleaning the substrate, the method comprises:
stripping the photoresist etch mask and residue from the substrate;
exposing the substrate to a solvent having a pH between about 3 to 12; and
rinsing the exposed substrate in distilled water.

14. A method for removal of residue after plasma etching a layer comprising a metal using a photoresist etch mask, said layer formed on a substrate, comprising:

cleaning the substrate in a solution consisting essentially of deionized water and between 0.1 and 10% of hydrogen fluoride by weight, the substrate having residue from etching at least one of Ta, TaN, Go, Fe, Mn, Ni, Fe, Cr, Ru, Pt, and Ir; and rinsing the cleaned substrate in distilled water.

15. The method of claim 14 further comprising:

stripping the photoresist etch mask and residue from the substrate;

exposing the substrate to a solvent having a pH between about 3 to 12; and rinsing the exposed substrate in distilled water.

16. A method for removal of residue after plasma etching a layer comprising a metal using a photoresist etch mask, said layer formed on a substrate, comprising:

cleaning the substrate in a solution consisting essentially of hydrogen fluoride and deionized water to remove metallic residue from the substrate, the metallic residue from etching at least one of Ta, TaN, Co, Fe, Mn, Ni, Fe, Cr, Ru, Pt, and Ir;

rinsing the cleaned substrate in distilled water;

stripping the photoresist etch mask and residue from the substrate;

exposing the substrate to a solvent having a pH between about 3 to 12; and rinsing the exposed substrate in distilled water.

17. The method of claim 16, wherein the solution comprises between 0.1 and 10% of hydrogen fluoride by weight.

18. A method of fabricating a magneto-resistive random access memory (MRAM) device from a film stack comprising a top electrode layer, a free magnetic layer, a tunnel layer, a magnetic film stack, a bottom electrode layer, and a barrier layer that are formed on a semiconductor substrate, comprising:

forming a photoresist etch mask on the top electrode layer;

etching the top electrode layer, free magnetic layer, tunnel layer, magnetic film stack, and bottom electrode layer;

cleaning the substrate in a solution comprising, by weight, between 0.1 and 10% of hydrogen fluoride;

rinsing the substrate in distilled water until traces of said solution are removed;

stripping the photoresist etch mask and residue from the substrate;

exposing the substrate to a solvent having a pH between about 3 to 12; and rinsing the substrate in distilled water until traces of said solvent are removed.

19. A method of fabricating a magneto-resistive random access memory (MRAM) device from a film stack comprising a top electrode layer, a free magnetic layer, a tunnel layer, a magnetic film stack, a bottom electrode layer, and a barrier layer that are formed on a semiconductor substrate, comprising:

forming a photoresist etch mask on the top electrode layer;

etching the top electrode layer and free magnetic layer;

cleaning the substrate in a first solution comprising, by weight, between 0.1 and 10% of hydrogen fluoride;

rinsing the substrate in distilled water until traces of said solution are removed;

reapplying the photoresist etch mask on the top electrode layer;

etching the magnetic film stack and bottom electrode layer;

cleaning the substrate in a second solution comprising, by weight, between 0.1 and 10% of hydrogen fluoride;

rinsing the substrate in distilled water until traces of said solvent are removed;

stripping the photoresist etch mask and residue from the substrate;

exposing the substrate to a solvent having a pH between about 3 to 12; and rinsing the substrate in distilled water until traces of said solvent are removed.

* * * * *